United States Patent [19]

Akao et al.

[11] Patent Number: 4,920,375

[45] Date of Patent: Apr. 24, 1990

[54] IMAGING DEVICE

[75] Inventors: Michitoshi Akao, Nagoya; Kenji Sakakibara; Tokunori Katoh, both of Ichinomiya; Yukichi Sawaki, Gifu; Takakuni Sonoda; Makoto Suzuki, both of Nagoya, all of Japan

[73] Assignee: Brother Kogyo Kabushiki Kaisha, Japan

[21] Appl. No.: 324,292

[22] Filed: Mar. 15, 1989

[30] Foreign Application Priority Data

Mar. 16, 1988 [JP] Japan ............................. 63-62814
Mar. 19, 1988 [JP] Japan ............................. 63-36762[U]
Sep. 8, 1988 [JP] Japan ............................. 63-225312

[51] Int. Cl.⁵ .......................................... G03B 27/32
[52] U.S. Cl. ............................................ 355/27; 355/100
[58] Field of Search ................. 355/27, 28, 100, 106, 355/295; 354/304, 339; 430/138

[56] References Cited

U.S. PATENT DOCUMENTS 4,714,943 12/1987 Sakakibara et al. ................. 355/27
4,727,392 2/1988 Stone et al. ........................... 355/27
4,816,873 3/1989 Hatta .................................... 355/27

Primary Examiner—L. T. Hix
Assistant Examiner—Khanh Dang
Attorney, Agent, or Firm—Kane, Dalsimer, Sullivan, Kurucz, Levy, Eisele and Richard

[57] ABSTRACT

In an imaging device such as a copying machine employing a continuous-form photo and pressure sensitive recording medium, a pair of rollers are adapted to be brought into and out of contact with each other for executing a pressure developing operation.

At least one of the rollers is being rotated when that the pair of rollers are being closed or opened to each other.

8 Claims, 5 Drawing Sheets

IMAGING DEVICE

BACKGROUND OF THE INVENTION

This invention relates to an imaging device, more particularly, to an imaging device employing a recording medium which carries thereon a plurality of photo and pressure sensitive microcapsules, each microcapsule containing therein a chromogenic material and a photo-curable or photo-softenable resin.

The imaging device of this type comprises, for instance, as disclosed in the U.S. Pat. No. 4399209, exposure means for exposing the recording medium to an optical image so as to form a latent image thereon corresponding to an image to be recorded, and a pressure-developing means for pressing the recording medium carrying the latent image and a separate developing medium coated with a developer which reacts to the chromogenic material, superposed one upon the other, to develop a visible image on the developing medium.

With the above imaging device, the latent image is formed on the recording medium by exposing the optical image thereon to selectively cure the photo-curable resins or soften the photo-softenable resins enveloped in the microcapsules existing on the area, to which the optical image is exposed. The latent image thus formed on the recording medium is then transferred and developed on the separate developing medium.

Transferring of the image is executed by superposing the recording medium and the developing medium one on the other and pressurizing the superposed mediums so that the unhardened or softened microcapsules on the recording medium are ruptured by the applied pressure and the chromogenic materials enveloped therin are streamed out of the ruptured microcapsules. The streamed-out chromogenic materials are reacted to the developer coated on the developing medium so as to form the visible image thereon corresponding to the above latent image.

In order to make the arrangements in the device and maintenances therefore simple and easy, the continuous form of the above recording medium, one end of which is rolled on a feed roll while the other end on a take-up roll, has been employed. On the other hand, as the developing medium, a cut-sheet form cut into pieces of the predetermined size is used.

With this continuous form recording medium, it is fed from the feed roll to the take-up roll through the exposure means and the pressure-developing means. When it passes through the exposure means, the latent image is formed thereon, and when it passes through the pressure-developing means, the latent image is transferred and developed onto the cut-sheet-form developing mediums which are successively supplied to be superposed on the corresponding areas of the continuous recording medium before it reaches the pressure-developing means.

With employing the above continuous-form recording medium, however, there arises a problem. That is, in the imaging device of the above type, the pressure-developing means usualy comprises a pair of pressure rollers adapted to be brought into and out of contact with each other.

The rollers are kept out of contact until the leading end of the developer medium is put between the rollers, and thereafter the rollers are brought into contact and start rotation for pressure developement.

With the above arrangement, however, the rollers begin rotation after they have clamped the recording medium and the developing medium between them under pressure. As a result, the leading end of the developing medium clamped by the rollers is kept under pressure for a longer time than other parts of the medium, so that even the hardened or unsoftened microcapsules on the recording medium are crushed to cause the chromagenic materials to be streamed out of them, resulting in a black line appearing on the leading end of the developing medium. Also, when terminating the pressure developing operation, it is only after completion of pressure development that the rollers stop rotation and are away from each other, so that the trailing end of the developer medium is pressurized for a longer time than other parts of the medium, again resulting in a similar black line appearing on this part.

SUMMARY OF THE INVENTION

It is therefore an object of the invention to provide an improved imaging device capable of eliminating above deficiencies of the conventional devices.

For this purpose, according to the invention, there is provided an imaging device employing a continuous-form recording medium coated with a plurality of photo and pressure sensitive microcapsules, of each of said microcapsules enveloping therein a chromogenic material and a photo-sensitive rasin, said imaging device comprising:

exposure means for exposing an optical image on said recording medium;

a pair of pressure-developing rollers, adapted to be brought into and out of contact with each other, for pressurizing the exposed recording medium to develop a visible image;

drive means for rotating at least one of the pressure-developing rollers;

shift means for shifting at least one of the pressure-developing rollers toward or away from the other one of the pressure-developing rollers; and control means for controlling said drive means and said shift means in such a fashion that said one of the pressure-developing rollers is kept being rotated by said drive means when said one of the pressure-developing rollers is shifted.

DESCRIPTION OF THE ACCOMPANYING DRAWINGS

Figure 3:
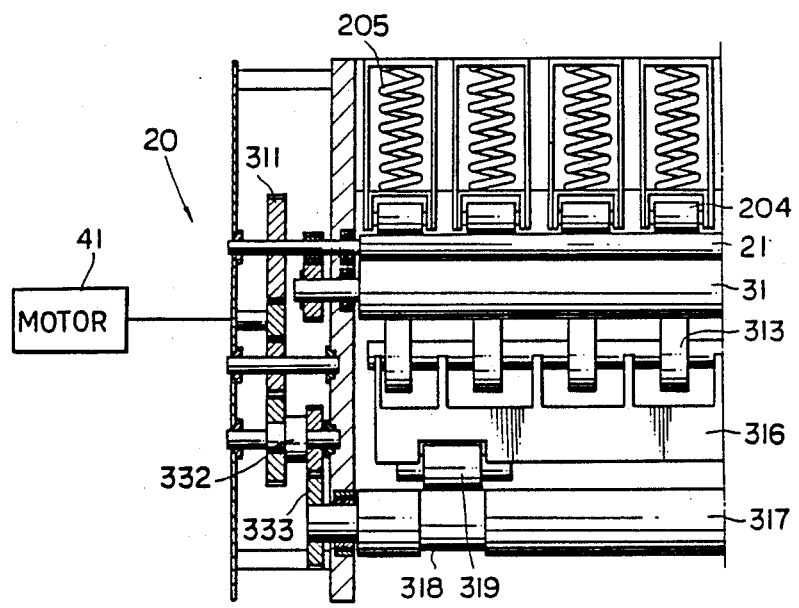
FIGS. 3 and 4 are partial elevations of the pressure developing unit of the imaging device of FIG. 1.
Figure 4:
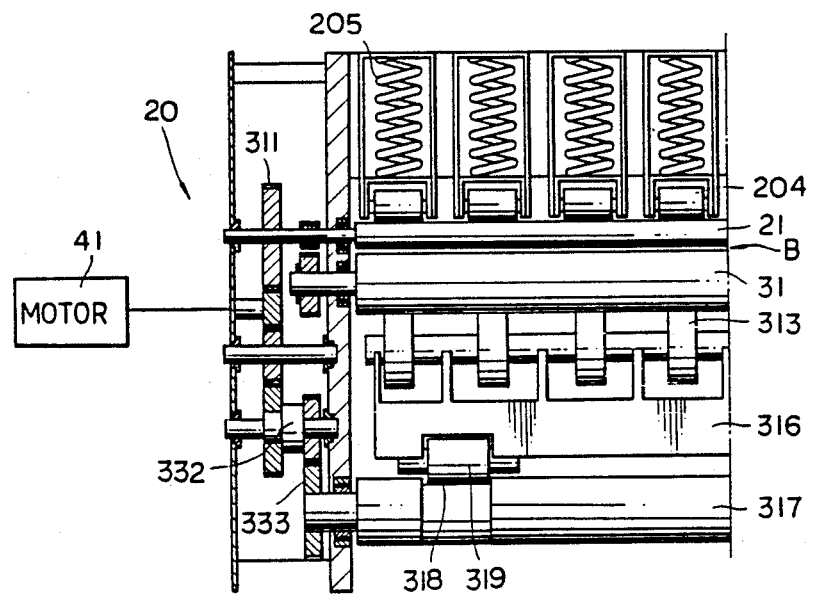
Figure 5:
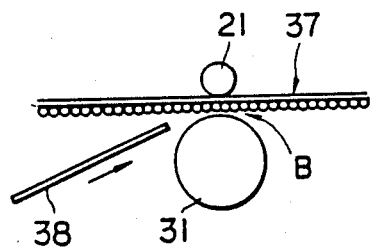
Figure 5:
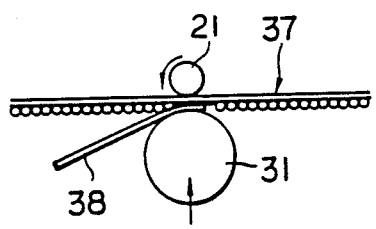
Figure 5:
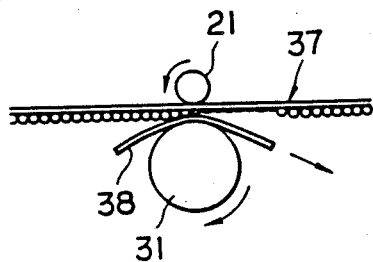
Figure 5:
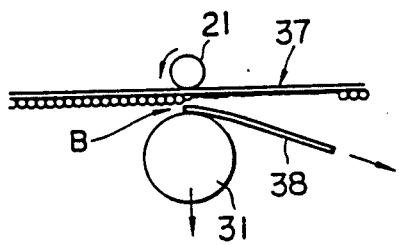
Figure 6:
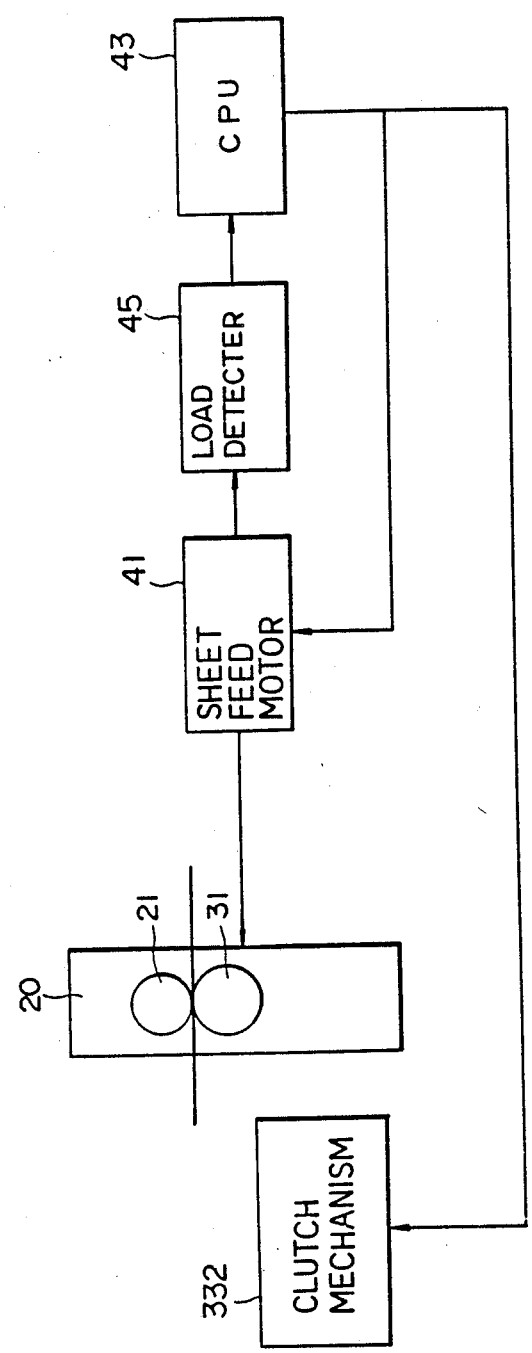

FIGS. 5(1) through 5(4) are explanatory views showing steps of pressure developing operation with the pressure developing unit of FIGS. 3 and 4; and FIG. 6 is a black diagram of a modified electronic control system.

DESCRIPTION OF THE EMBODIMENTS

Figure 1:
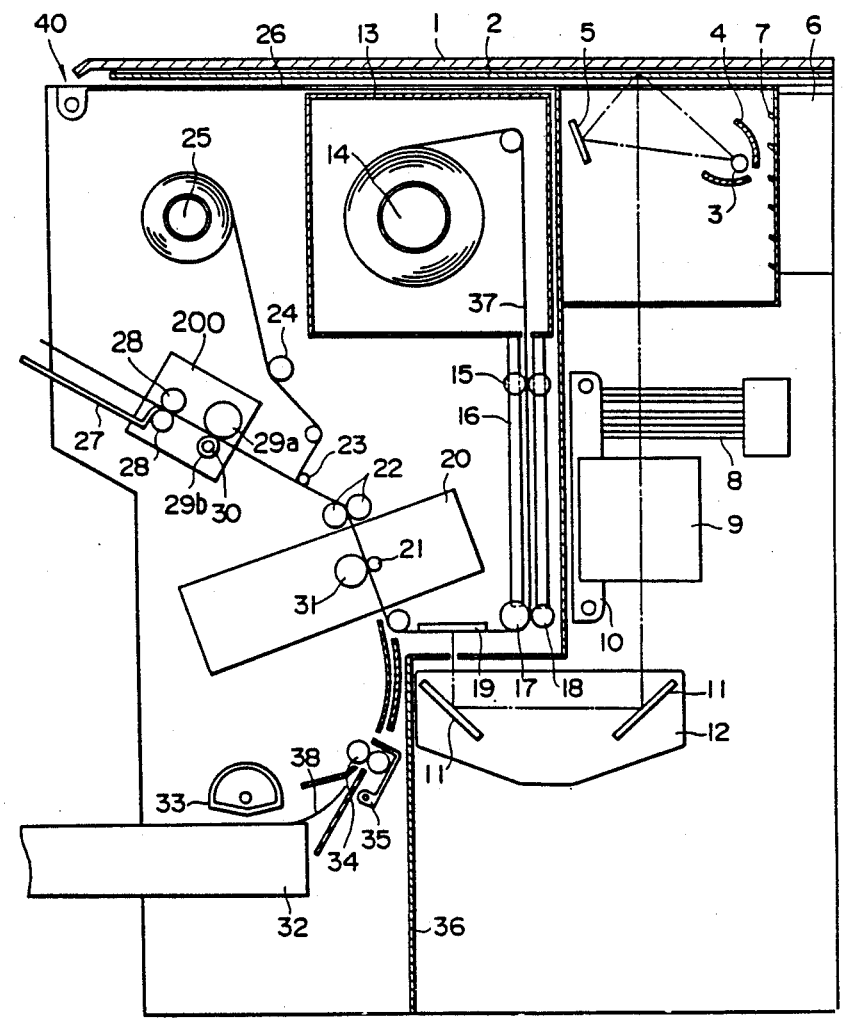
FIG. 1 is a schematic sectional view of the imaging device embodying the invention.
Figure 2:
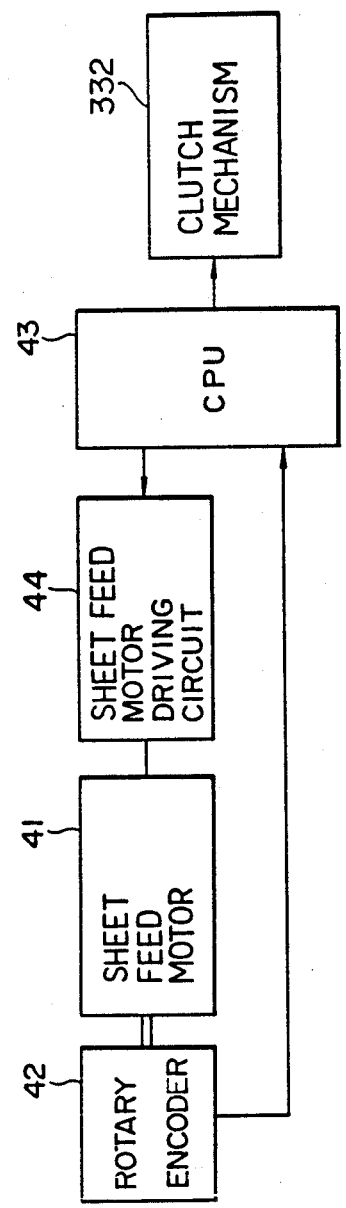
FIG. 2 is a black diagram of an electrinic control system of the imaging device of FIG. 1.

FIG. 1 is a schematic sectional view of a full-color copying machine 40 embodying the invention, and FIG. 2 is a block diagram of an electronic control unit equipped in the copying machine 40 of FIG. 1.

The copying machine 40 includes, as shown, a glass tray 2 and a tray cover 1, between which an original image subject, not shown, is placed up side down. Both the cover 1 and the tray 2 are reciprocally movable rightward and leftward in FIG. 1 as one unit. Secured to the upper right portion, in FIG. 1, of the machine 40 is a halogen lamp 3 extending perpendicularly to the direction of the reciprocal movement of the glass tray 2, and a semi-cylindrical reflection mirror 4 located to surround the lamp 3, so that it shines the original subject through the glass tray 2.

As the glass tray 2 is reciprocated, the light beams emitted from the halogen lamp 3 are allowed to shine the whole surface of the glass tray 2 from its left end to right. The light beams emitted from the lamp 3 pass through the glass tray 2 and are reflected on the original subject placed thereon. Further, in order to use the light emitted from the lamp 3 for shining the original subject with a greater efficiency, a reflector 5 is provided so that the light beams that were not directed to the original subject are reflected there toward the original subject.

A fan 6 and a louver wall 7 are provided to the right of the lamp 3 to intake air from outside. This allows the glass tray 2 to be well cooled.

The light beams emitted from the halogen lamp 3 and reflected from the original subject placed on the glass tray 2 are led to a lens system 9 through a filter 8. The filter 8 is provided with at least three filter sections, each section selectively passing the light which has a wavelength corresponding to the sensitivity of one of at least three groups of microcapsules of a recording sheet 37 so as to adjust tonality of the duplicated image. As the recording sheet 37, in this embodiment, the continuous form coated with a plurality of microcapsules each containing therein a chromagenic material and a photo-curable resin, as has been proposed in Japanese Patent Provisional Publication No. SHO58-88739, is employed. That is, at least three kinds of microcapsules corresponding to magenta, yellow and cyan colors, respectively, are uniformly distributed on the recording sheet 37. The lens system 9 is mounted on a lens mount plate 10 with a possibility of fine angle adjustment with respect to the optical path thereof.

The light beams passed through the filter 8 and converged by the lens system 9 are turned at an angle of 180 degrees by means of a pair of opposedly arranged reflection mirrors 11, 11, and form a latent image on the recording sheet 37 which is in close contact with the down side of an exposure tray 19. The two reflection mirrors 11, 11 are fixedly mounted on a mirror mount plate 12 so that adjustment of the optical path and focusing takes place by fine adjustment of the position of the mirror mount plate 12.

The recording sheet 37 in the continuous form is wrapped around a cartridge shaft 14 which is housed in a detachable cartridge 13 located under the glass tray 2. One end of the sheet 37 reaches a take-up shaft 25 by way of multiple rollers and a pressure developing unit 20.

The recording sheet 37 coming from the underside of the cartridge 13 is guided along the underface of the exposure tray 19 by means of feed rollers 15, 15 and guide rollers 17, 18 and fed to the pressure developing unit 20. The sheet 37 passed through the pressure developing unit 20 is then sent to a separation roller 23 and a winding run adjustment roller 24, and is taken up onto the take-up shaft 25. The unexposed sheet 37 leaving the cartridge 13 is protected against light by means of a shield cover 16.

The recording sheet 37 is controlled by paper feed rollers 22, 22 to travel at a constant feed rate in synchronism with the speed of the reciprocal movement of the glass tray 2. Thus, the latent image of a certain line on the original subject is built one by one on the sheet 37 while it is passed along the exposure tray 19.

Below the pressure developing unit 20, located is a developer sheet cassette 32 accommodating cut-sheet type developer sheets 38. The developer sheet 38 is picked out one by one by means of a semi-cylindrical roller 33 and is transferred by means of a pair of developer sheet rollers 34, 34 through a swingable gate 35 to be brought into the pressure developing unit 20, in such a fashion that the recording sheet 37 and the developer sheet 38 are sent together to the pressure developing unit 20 in a superposed state. The pressure developing unit 20 consists of a small-diameter roller 21 and a backup roller 31. The superposed sheets 37 and 38 are thus pinched and pressed between the small-diameter roller 21 and the backup roller 31, with the inside surface of the recording sheet 37, on which the latent image is formed, contacting with the inside surface of the developer sheet 38 which is coated with a developing agent. With this pressurizing, the microcapsules remaining unexposed are crushed to develop a visible image on the developer sheet 38.

The recording sheet 37 and the developer sheet 38 leaving the pressure developing unit 20 are then travelled by means of the rollers 22. The recording sheet 37 and the developer sheet 38 are then separated from each other by the separation roller 23, the former going in upward direction and the latter leftward in FIG. 1. The developed image on the developer sheet 38 is fixed by means of a thermal setting unit 200. The developer sheet 38 is then discharged to a sheet outlet tray 27 with the image-carrying side facing up. The heat setting unit 200 consists of a pair of a roller 29a and a hollow heat roller 29b accommodating a heater 30 therein and a pair of feed rollers 28, 28.

The recording sheet 38 separated is taken up around the take-up shaft 25 by way of the winding run adjusting roller 24.

There is an optical rotary encoder 42, not shown in FIG. 1 but shown in FIG. 2, mounted on the shaft of one of the feed rollers 22, 22 driven by a sheet feed motor 41. This is used not only to control the feed rate of the recording sheet 37 at a constant level but also to detect the feed volume of the recording sheet 37. The signals from the optical rotary encoder 42 are sent to a CPU (Central Processing Unit) 43 so as to steadily count the feed volume. The motor 41 is driven by the CPU 43 through a sheet feed motor driving circuit 44.

In the pressure developing unit 20, the small-diameter roller 21 and the backup roller 31 are adapted to open (be spaced from each other) and close (be brought into contact with each other).

FIGS. 3 and 4 are side elevations each showing a schematic structure of the pressure developing unit 20.

In the unit 20, the small-diameter upper roller 21 is biased toward the backup roller 31 by coil springs 205 through a plurality of contact rollers 204, and is rotatably retained in the unit 20.

The lower backup roller 31 has a larger diameter than the upper roller 21 and is rotatably mounted in the unit 20 to be moved into and out of contact with the upper roller 21. The lower roller 31 is retained by more than one contact rollers 313, which are rotatably mounted on a common support 316. At each end of the support 316 opposite to the contact rollers 313, provided is a rotatable support roller 319. Each support roller 319 is in constant contact with the cam section 318 of a cam roll 317 so that at each half a turn of the cam section 318 (through 180 degrees) due to rotation of the cam roll 317, the roller 31 is moved up and down, through the support roller 319, the support 316 and the contact rollers 313, into and out of contact with the upper roller 21. The upper roller 21 itself is movable upward within a certain distance from a given position but is kept away from downward movement from the given position. With this arrangement, a clearance B as shown in FIG. 4 is made between the upper and lower rollers 21 and 31 when the lower roller 31 is moved downward.

The roller 21 is rotatably driven by the sheet feed motor 431 via a speed reduction mechanism 311. The cam roller 317 is also driven by the same motor 41 via a speed reduction mechanism 333. The latter mechanism 333 has a clutch mechanism 332 which selectively effects or cuts off transmission of a rotation to the cam roller 317 with the motor 41 kept rotated.

The arrangement as described above is operated as described below.

When a start button, not shown, is pressed down, the glass tray 2 is moved rightward of FIG. 1 and is brought to a stop at a position where the left end of the glass tray 2 is to be shined with the halogen lamp 3. Then, the halogen lamp 3 is turned on, and the light emitted from the lamp 3 is reflected by the original subject on the tray 2 and transmitted through the filter 8, the lens system 9 and the reflection mirrors 11, 11 to form a latent image on the recording sheet 37 placed under the pressure tray 19. The recording sheet 37 moves leftward along the exposure tray 19 at the same speed as the reciprocation speed of the glass tray 2, and therefore a latent image corresponding to the original subject is eventually formed on the recording sheet 37.

With the leftward movement of the glass tray 2, the developer sheet 38 is picked up by the semi-cylindrical roller 33 from the developer sheet cassette 32 and is laid upon the exposed part of the recording sheet 37 to be fed to the pressure developing unit 20 in the superposed sate.

Operation of the pressure developing unit 20 is now described with reference to FIG. 5(1) through 5(4).

Before starting pressure developing operation, the lower roller 31 is spaced from the the upper roller 21 making the clearance B between the two rollers 21 and 31, and there is only the recording sheet 37 put between the rollers 21 and 31, as in illustrated FIG. 5(1).

When the leading end of the developer sheet 38 has reached into the clearance B between the rollers 21 and 31, the CPU 43 detects that the count value of the signals sent from the optical rotary encoder 42 coincides with the timing for closing the rollers 21 and 31. The clutch mechanism 332 then comes into operation to rotate the cam roller 317 by half a turn, whereupon the lower roller 31 is moved toward the upper roller 21 to clamp the leading end of the developer sheet 38 between the rollers 21 and 31. A pressure is applied to the superposed sheets 37 and 38, while at the same time the roller 31 come into rotation to travel the superposed sheets 37 and 38 in a predetermined direction, i.e., rightward in FIG. 5(2). Afterwards, the roller pair 21 and 31 continues rotation while the cam roll 317 stands still as in FIG. 5(3). Since the developer sheet 38 is in cut form, when the trailing end of the developer sheet 38 is reached to the roller pair 21 and 31, the CPU 43 detects that the count value of the signal from the optical rotary encoder 42 coincides with the timing for opening the rollers 21 and 31, the clutch mechanism 332 is operated to turn the cam roller 317 by half a turn. With the roller 21 kept rotated, the lower roller 31 is moved down to be spaced from the upper roller 21 to remove the pressure applied to the sheets 37 and 38. In this state, the clearance B is again created between the rollers 21 and 31. Thus terminating the pressure developing operation as in FIG. 5(4).

Although in the aforementioned embodiment, the CPU 43 detects that the count value of the signals sent from the encoder 42, the CPU 43 may, instead, detect the variation of the driving torque of the motor 41 as in the modified arrangement illustrated in FIG. 6.

In this modification, the pressure rollers 21 and 31 of the pressure developing unit 20 are opposedly arranged with the space greater than the thickness of the recording sheet 37 and smaller than the sum of the thickness of the recording sheet 37 and that of the developer sheet 38. Accordingly, when the sheet 38 is inserted between the rollers 21 and 31, the load, i.e., the drive torque of the motor 41 increases. The load variation of the motor 41 is detected by a load detector 45, whereupon the CPU 32 determines that the developer sheet 38 has come between the rollers 21 and 31. The load variation can be detected, for instance, by monitoring the amount of the electric current in the motor 41. Then, the rollers 21 and 31 are brought into their closed position to apply a sufficient pressure onto the superposed sheets 37 and 38, so as to transfer and develop a visible image on the developer sheet 38. After completing pressure development, the rollers 21, and 31 are brought back to their open position.

Although in the aforementioned embodiments, the roller 21, the rollers 22 and the cam roll 317 are driven by the same motor 41, they may of course be operated by separate motors. Further, although the roller 21 is kept rotated when the roller 31 is moved to or apart from it, the both rollers 21 and 31 may be kept rotated at the same circumferential speed, and the rollers 21 and 31 may both be moved to and apart from each other.

Moreover, although in the aferementioned embodiment, the recording medium coated with the microcapsules enveloping therein the photo-curable resin is employed, the recording medium coated with the microcapsules enveloping therein the photo-softenable resin may be instead employed.

What is claimed is:

1. An imaging device employing a continuous-form recording medium coated with a plurality of photo and pressure sensitive microcapsules, each of said microcapsules enveloping therein a chromogenic material and a photo-sensitive resin, said imaging device comprising:

exposure means for exposing an optical image on said recording medium;

a pair of pressure-developing rollers, adapted to be brought into and out of contact with each other, for pressurizing the exposed recording medium to develop a visible image;

drive means for rotating a first roller of the pressure-developing rollers;

shift means for shifting a second roller of the pressure-developing rollers toward or away from the first roller of the pressure-developing rollers; and control means for controlling said drive means and said shift means in such a fashion that said first roller of the pressure-developing rollers is kept rotating by said drive means when said second roller of the pressure-developing rollers is shifted out of contact with said first roller.

2. The imaging device according to claim 1 which further comprises monitoring means for monitoring an amount of travel of said recording medium inside the device; and wherein said control means takes a timing to shift said second roller of the pressure-developing rollers depending upon said amount of the travel of the recording medium.

3. The imaging device according to claim 2 which further comprises at least one pair of transfer rollers for transferring said recording medium, and wherein said monitoring means includes an optical rotary encoder coupled to one of said transfer rollers.

4. The imaging device according to claim 1, which further employs a developing medium coated with a developer material; and wherein said recording medium is pressurized by said pressure-developing rollers, with said developing medium being superposed on said recording medium, so that the chromogenic materials streamed out of the microcapsules crushed by said pressure-developing rollers react to said developer material to develop a visible image on said developing medium.

5. The imaging device according to claim 4, which further comprises detecting means for detection of torque variation in said drive means; wherein said pair of pressure-developing rollers are arranged to have a spacing between them when said second roller of the pressure-developing rollers has been shifted away from the said first roller, said spacing being set to be larger than a thickness of said recording medium and smaller than a total sum of a thickness of said recording medium and said developing medium; and wherein said control means takes a timing to shift said second roller of the pressure-developing rollers depending upon the detection of the torque variation in said drive means.

6. The imaging device according to claim 5, wherein said drive means includes a driving motor;

wherein said control means controls said driving motor to rotate said first roller of the pressure-developing rollers at a constant speed; and wherein said detecting means detects the torque variation by monitoring driving electric current in said driving motor.

7. The imaging device according to claim 1, wherein said control means controls said drive means to drive said first roller of a pressure-developing rollers, when said pressure-developing rollers are out of contact, at a speed lower than a speed at a time the pressure-developing rollers are in contact with each other.

8. The imaging device according to claim 1, wherein said shift means further comprises a cam roll having a cam section, said cam section being arranged to shift said second roller of the pressure-developing rollers at each half a turn of said cam roll.

* * * * *